United States Patent
Kawamura et al.

(10) Patent No.: US 6,925,005 B2
(45) Date of Patent: Aug. 2, 2005

(54) AC SENSING METHOD MEMORY CIRCUIT

(75) Inventors: Shoichi Kawamura, Kawasaki (JP); Masaru Yano, Kawasaki (JP); Makoto Niimi, Aichi (JP); Kenji Nagai, Aichi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/647,441

(22) Filed: Aug. 26, 2003

(65) Prior Publication Data

US 2004/0088470 A1 May 6, 2004

(30) Foreign Application Priority Data

Aug. 27, 2002 (JP) .......................................... 2002-247345

(51) Int. Cl.$^7$ .............................................. G11C 16/04
(52) U.S. Cl. .............................. 365/185.12; 365/185.23; 365/185.25
(58) Field of Search ......................... 365/185.12, 185.25, 365/230.06, 203, 185.23, 185.15, 185.2, 204

(56) References Cited

U.S. PATENT DOCUMENTS 5,954,828 A * 9/1999 Lin .............................. 365/201
2001/0005015 A1 * 6/2001 Futatsuyama et al. . 365/185.17

* cited by examiner

*Primary Examiner*—Thong Q. Le
(74) *Attorney, Agent, or Firm*—Arent Fox PLLC

(57) ABSTRACT

The present invention is a memory circuit, comprises: a memory cell array including a plurality of bit lines, a plurality of word lines, and a plurality of memory cells disposed in the positions of intersection between the bit lines and the word lines; and a page buffer, which is connected to the bit line and which detects memory cell data by judging with predetermined sense timing the potential of the bit line when a pre-charged bit line potential is discharged in accordance to a cell current of a selected memory cell. Further the sense timing differs in accordance with the position of the selected memory cell in the memory cell array.

13 Claims, 15 Drawing Sheets

FIRST EMBODIMENT

PAGE BUFFER 100

POWER SUPPLY CIRCUIT 101

FIRST EMBODIMENT

SECOND EMBODIMENT

THIRD EMBODIMENT

_US 6,925,005 B2_

AC SENSING METHOD MEMORY CIRCUIT

CROSS-REFERENCE TO RELATED APPLICATIONS

This application is based upon and claims the benefit of priority from the prior Japanese Patent Application No. 2002-247345, filed on Aug. 27, 2002, the entire contents of which are incorporated herein by reference.

BACKGROUND OF THE INVENTION

1. Field of the Invention

The present invention relates to an AC sensing method memory circuit, and more particularly to a memory circuit capable of suitably detecting data of memory cells even though the data capacity is increased.

2. Description of the Related Art

There has been an increasing demand to increase the capacity of nonvolatile semiconductor memory, which is one kind of semiconductor memory circuit, and to reduce the voltages thereof. The voltage reduction is directed toward the conservation of electric power by enabling operation at lower voltages. This voltage reduction is accompanied by a trend toward a reduction in the cell current that is able to flow in the memory cells. On the other hand, an increased capacity involves longer word lines and bit lines in the cell array and an increase in the number of cells which are connected to these lines, which results in a larger capacitance. In addition, the word lines and bit lines, and the like, become finer and the resistance thereof increases accordingly. Such an increase in the RC (Resistance and Capacitance) value results in an increase in the delay when the word lines are driven by a word driver and when select lines are driven, together with an increase in the delay in the discharge of a bit line potential by a cell current.

More particularly as a result of the increase in the bit-line RC value, the DC sensing method, which detects cell data by converting the change in a bit line current, in accordance with the presence or absence of a cell current while a current is flowing in the bit line, into a voltage, is becoming an obsolete sensing method.

An AC sensing method has been proposed in place of this DC sensing method. According to this AC sensing method, the bit lines are pre-charged to a certain potential, and after the bit lines have assumed a floating state, the bit lines are discharged by a cell current for a predetermined period, and cell data is detected on the basis of whether the bit line potential is discharged to a predetermined potential. Because current is not supplied to the bit lines during sensing, the readout sensitivity can be kept high even if the cell current is small.

FIG. 1 is a circuit diagram of a NAND-type flash memory which is one kind of conventional nonvolatile memory. A memory cell array MCA is provided with a plurality of local bit lines LBL0-0 to LBL1-1, and word lines WL0-0 to WLn-1, and memory cell transistors MC that comprise a floating gate or trapping gate are disposed in the positions of intersection between the bit lines and word lines. In the example in FIG. 1, a pair of local bit line pairs are connected via transistors, which are selected by global select signals GSG1 and GSG2, to global bit lines GBL0 and GBL1. Further, there are n+1 memory cells MC which each constitute a single cell string CSTG, and the cell strings CSTG are connected to local bit lines LBL via transistors selected by select signals SG1-0 and SG1-1 and are connected to a ground potential ARVSS in the memory cell array via transistors which are selected by select signals SG2-0 and SG2-1. Further, each local bit line LBL is connected to a power supply circuit 101, and assumes a different potential or state during programming and erasure operations, and at other times.

The global bit lines GBL0 and GBL1 are connected to respective page buffers 100, and the page buffers are connected to the cell strings of selected memory cells via the global bit lines GBL and local bit lines LBL. The page buffers 100 buffer write data which is supplied from outside during programming and output this data to the memory cells. Also, during read and verify operations and so forth, the page buffers 100 detect a bit line potential which changes in accordance with the presence or absence of a cell current in the memory cells, whereby the cell data is read out.

FIG. 2 is a circuit diagram of a page buffer that comprises a latch circuit 10, which is connected to an input/output terminal I/O (not shown), and transistors P1 and N1 to N5. Further, FIG. 3 is a circuit diagram of a power supply circuit. The power supply circuit 101 comprises a NOR gate 12 and transistors P6, P7 and N8, and generates a bit line bias potential BLBIAS. In other words, during programming, a programming control signal PGM assumes a high level, and an erasure control signal ERS assumes a low level such that the P channel transistors P6 and P7 are both conductive, and the bit line bias potential BLBIAS is then at the level of the supply voltage Vcc. On the other hand, during erasure, the control signals are inverted such that the transistors P6 and N8 are both non-conductive, and the bit line bias potential BLBIAS then assumes a floating state, being otherwise at ground potential.

A description follows for a conventional AC sensing method by means of a page buffer circuit. FIG. 4 is a timing chart of a conventional AC sensing operation during reading. A read operation comprises a preset period T0 which resets the latch circuit 10 in the page buffer, a pre-charge period T1 for pre-charging the bit lines, and a sense period T2 which detects data from a change in the bit line potential as a result of the bit lines being discharged in accordance with the presence or absence of a cell current.

In the preset period T0, the control signals are: BIAS=Vcc (high level), BLCNTL=Vcc, PGMON=Vcc, DIS=Vcc, GSG1=Vcc+α, GSG2=0v, SG1-0=0v, SG2-0=0v, and the selected word line WL0-0=0v, the unselected word line WLS-0=Vcc+α, and BLBIAS=0v. Accordingly, the discharge transistor N2 is conductive as a result of the signal DIS, and the nodes A and B of the latch circuit 10 in the page buffer 100 are preset to a low level and a high level respectively. Further, the global bit lines GBL0 and GBL1, and the local bit lines LBL0-0, LBL1-0, LBL0-1, and LBL1-1 are 0v. Further, for an unselected cell string, SG1-1=0v, SG2-1=0v, WL0-1=WLn-1=floating state.

Thereafter, in the pre-charge period T1, the control signals are such that BIAS=Vss (low level), the transistor P1 is conductive, the signal BLCNTL is a voltage high enough to permit the global bit lines and the local bit lines to be at the pre-charge level, GSG1=VCC+α, GSG2=0v, SG1-0=VCC+α, SG2-0=0v, the selected word line WL0-0=0v, and the unselected word line WLS-0=VCC+α. By applying the supply voltage Vcc to the bit lines via the respective pre-charge transistor P1 in the page buffers which is caused to conduct by the signal BIAS, the global bit lines GBL0 and GBL1 and the local bit lines LBL0-0 and LBL0-1 are pre-charged. Accordingly, the respective sense node SNS in the page buffers is also at a high level. Further, the unselected local bit lines remain LBL1-0=0v, and LBL1-1=0v as a result of the bias potential BLBIAS of the power supply circuit 101.

Further, in the sense period T2, the control signal BIAS is restored to a high level and the pre-charge transistor P1 is non-conductive, thus breaking the current supply circuit for supplying current to the bit lines. Further, when the control signal BLCNTL is at a predetermined level, the select signal SG2-0=Vcc+α, and the cell string CSTG is connected to the array ground voltage ARVSS. As a result, when a memory cell MC is in an erased state (data 1) and the threshold thereof is lower than ground, the bit line is discharged on account of the generation of a cell current (see the solid line in the FIG. 4). Further, when a memory cell MC is in a programmed state (data 0) and the threshold thereof is high, no cell current is generated and hence the bit line is not discharged (see the broken line in the FIG. 4). A change in the potential of the bit line brings about a change in the sense node SNS in the page buffer, and in response to a set signal SET that is generated with predetermined timing, the level of the sense node SNS is latched by the nodes A and B of the latch circuit 10.

FIG. 5 is a timing chart of a conventional program verify operation. In a program verify operation, after a programming pulse is applied to memory cells, it is detected whether or not the threshold voltage thereof is equal to or more than the program verify level by setting the word lines to the program verify level to read out the cell data. Therefore, this operation is basically the same as the read operation of FIG. 4. This operation is different in that the latch circuit 10 in the page buffer is not preset during the preset period T0 and in that the level of the selected word line is not 0V but instead a positive value that is sufficient to secure a programming margin. Therefore, in FIG. 5, in the pre-charge period T1 and the sense period T2, the selected word line WL0-0 is controlled to be 1V.

As described above, the cell current decreases in accordance with a voltage reduction, and the capacitance and resistance of the bit lines increase in accordance with an increased capacity. Accordingly, the voltage discharge period, which pertains to the position at which the bit line is connected to the page buffer, when a bit line is discharged by a cell current and the sense node SNS in the page buffer accordingly changes to a low level, differs depending on the position of the selected memory cell. That is, when a memory cell that is disposed close to the page buffer 100 is selected, the discharge of the bit line propagates to the page buffer rapidly, and when a memory cell that is disposed a long way from a page buffer is selected, the discharge of the bit line propagates to the page buffer slowly.

In addition, in a memory cell that is disposed close to the word driver for driving the word lines, the rise in the word line and in the select line of the cell string is rapid, meaning that the initiation of the discharge is also rapid, whereas in a memory cell that is disposed a long way from the word driver, the rise in the word line and the select line is slow and the initiation of the bit line discharge is accordingly also slow. Examples in which the rise in the unselected word line WLs-0 and in the select line SG2-0 is slow are indicated by the broken lines in FIGS. 4 and 5. In this case, the timing for the initiation of the pre-charging of the bit lines is slow and therefore if the timing of the sense timing signal SET is fixed, only an inadequate discharge time interval is obtained.

On the other hand, in a conventional AC sensing method, because the pre-charge operation and the sensing operation are performed by means of the same timing irrespective of the positions of selected memory cells, when there are variations in the timing with which the discharge of the bit lines in the sensing operation is transmitted to the page buffers, the level of the detected sense node differs. This means that the threshold voltage distribution of the memory cell is extraordinarily wide and the memory reliability is therefore low.

The above problem similarly exists during a read operation and a program verify operation, and is also the same during an erase verify operation.

SUMMARY OF THE INVENTION

Accordingly, it is an object of the present invention to provide an AC sensing method memory circuit that is capable of performing detection of cell data by means of optimum timing irrespective of the positions of selected memory cells, and that substantially narrows the threshold voltage distribution of the memory cells.

In order to achieve the above object, one aspect of the present invention is a memory circuit, comprising: a memory cell array including a plurality of bit lines, a plurality of word lines, and a plurality of memory cells disposed in the positions of intersection between the bit lines and the word lines; and a page buffer, which is connected to the bit line and which detects memory cell data by judging with predetermined sense timing the potential of the bit line when a pre-charged bit line potential is discharged in accordance to a cell current of a selected memory cell, wherein the sense timing differs in accordance with the position of the selected memory cell in the memory cell array.

According to the above aspect of the invention, even when the cell current is reduced and the RC value of the bit lines and word lines and so forth is higher, with the AC sensing method, the sense timing for a bit line potential when the pre-charged bit line potential is discharged can be optimized. As a result, the distribution of the threshold voltages of the memory cells from the perspective of the page buffers becomes substantially narrower, whereby the reliability of the memory circuit is improved.

In a preferred embodiment for the above aspect of the invention, when the selected memory cell is positioned a first distance from the page buffer, the page buffer makes a judgment by means of first sense timing, and when the selected memory cell is positioned a second distance from the page buffer which is longer than the first distance, the page buffer makes a judgment by means of second sense timing that lags behind the first sense timing.

Furthermore, in a preferred embodiment for the above aspect of the invention, when the selected memory cell is positioned a first distance from a word line driver circuit for driving the word lines, the page buffer makes a judgment by means of first sense timing, and when the selected memory cell is positioned a second distance from the word line driver circuit which is longer than the first distance, the page buffer makes a judgment by means of second sense timing that lags behind the first sense timing.

In order to achieve the above object, the second aspect of the present invention is a memory circuit, comprising: a memory cell array including a plurality of bit lines, a plurality of word lines, and a plurality of memory cells disposed in the positions of intersection between the bit lines and the word lines; and a page buffer, which is connected to the bit line and which detects memory cell data by judging with predetermined sense timing the potential of the bit line when a pre-charged bit line potential is discharged in accordance to a cell current of a selected memory cell. Further, the memory circuit includes reference bit line in the memory cell array, and reference memory cells in the positions of intersection between the reference bit lines and the word lines, wherein the sense timing of the page buffer is determined in accordance with the potential of the reference bit line which is discharged by cell currents of the reference memory cells that belong to selected word line.

According to the above aspect of the invention, the sense timing of the page buffer is optimized by reference memory cells and reference bit lines which are connected to the selected word lines.

In a preferred embodiment for the above second aspect, the threshold voltage of the reference memory cells is set such that the reference bit line discharge produced by the reference memory cells lags behind the bit line discharge produced by the ordinary memory cells in an erased state. Optimizing the threshold voltages of the reference cells makes it possible to adequately increase the margin for the sense timing.

In a preferred embodiment for the above second aspect, the reference memory cells and the reference bit line include at least reference memory cells and a reference bit line for a read operation as well as reference memory cells and a reference bit line for a program verify operation; and the threshold voltage of the program verify reference memory cells is set such that the reference bit line discharge produced by the verify reference memory cells lags behind the bit line discharge produced by memory cells that are ordinary memory cells and not in a programmed state.

In a preferred embodiment for the above second aspect, the reference bit lines are disposed in the position in the memory cell array which is the furthest from the word line driver circuit. This disposition prevents the sense timing of the page buffers from being faster because of delaying the driving of the word lines.

In order to achieve the above object, the third aspect of the present invention is a memory circuit, comprising: a memory cell array including a plurality of bit lines, a plurality of word lines, and a plurality of memory cells disposed in the positions of intersection between the bit lines and the word lines; and a page buffer, which is connected to the bit line and which detects memory cell data by judging with predetermined sense timing the potential of the bit line when a pre-charged bit line potential is discharged in accordance to a cell current of a selected memory cell. Further, the memory cell array is divided into a plurality of regions in the word line direction, and the divided regions include reference bit lines and reference memory cells in the positions of intersection between the reference bit lines and the word lines; and the respective sense timing of the page buffers that belong to these divided regions is determined in accordance with the potential of the reference bit line which is discharged by cell current of reference memory cell that belong to a selected word line, in the corresponding divided regions.

According to the above third aspect, the bit line discharge periods until detection can be equalized irrespective of the positions of the selected memory cells, and hence the sense timing of the page buffers corresponding with the divided regions can be optimized. More particularly, because the margin between the threshold voltage of a verify reference memory cell, and the threshold voltage of a memory cell that is not in a programmed state or the threshold voltage of a memory cell that is in a programmed state is small, therefore, by equalizing the periods during which bit lines are discharged irrespective of the positions of the selected memory cells, it is possible to prevent a misjudgment that a memory cell in an unprogrammed state is in a programmed state, and a misjudgment that a memory cell in a programmed state is in an unprogrammed state.

In a preferred embodiment for the third aspect, the reference bit lines are disposed in the position in the divided regions which is the furthest from the word line driver circuit.

Furthermore, in the above third aspect, the reference memory cells and the reference bit lines include at least reference memory cells and a reference bit line for a read operation as well as reference memory cells and a reference bit line for a programming operation. Further, the reference memory cells and reference bit lines may include reference memory cells and a reference bit line for an erase operation.

DESCRIPTION OF THE PREFERRED EMBODIMENTS

Embodiments of the present invention will be described below with reference to the drawings. However, the scope of protection of the present invention is not limited to or by the embodiments below but rather is intended to cover the inventions appearing in the claims as well as any equivalents thereof.

Figure 1:
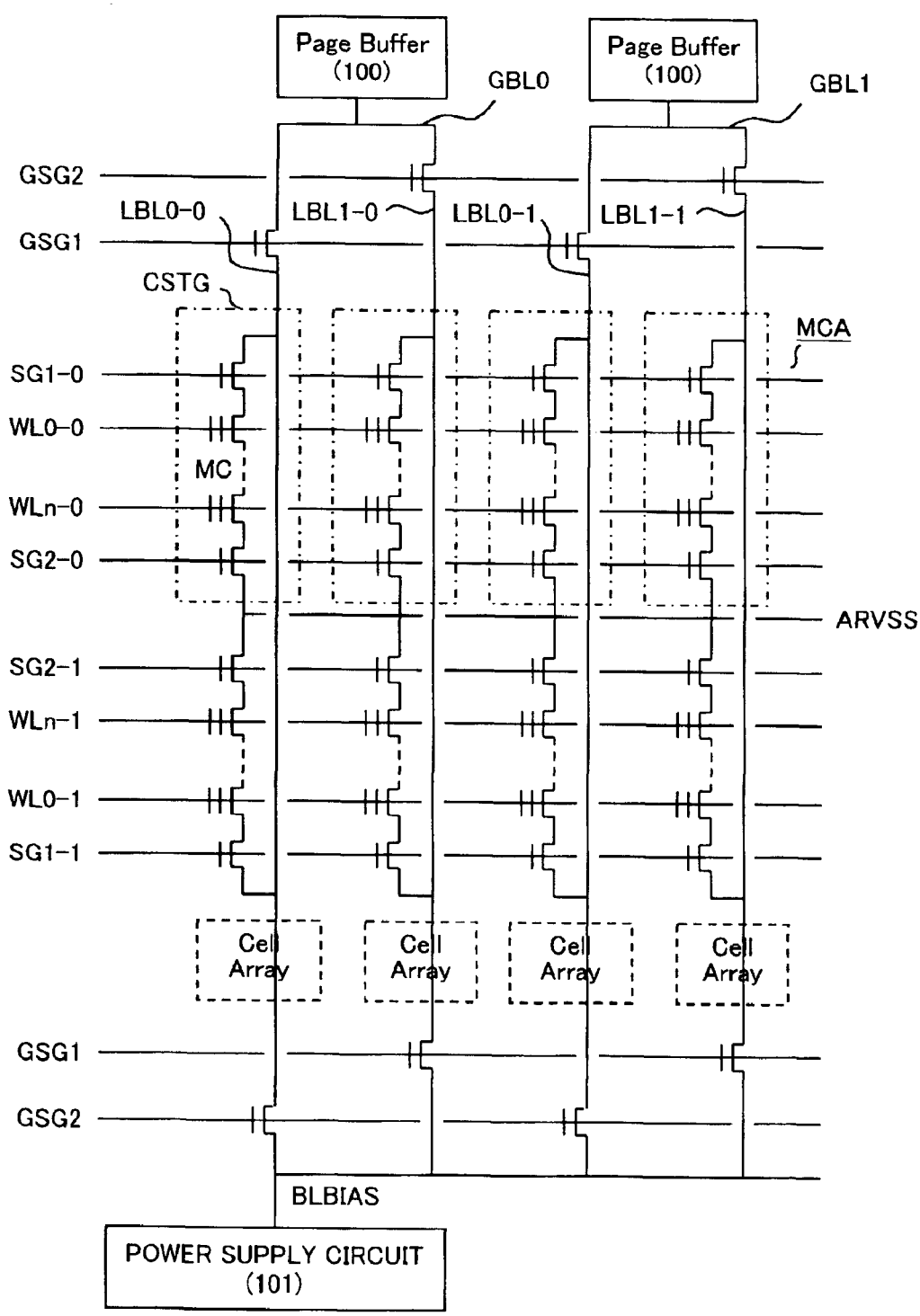
FIG. 1 is a circuit diagram of a NAND-type flash memory which is one kind of conventional nonvolatile memory.
Figure 6:
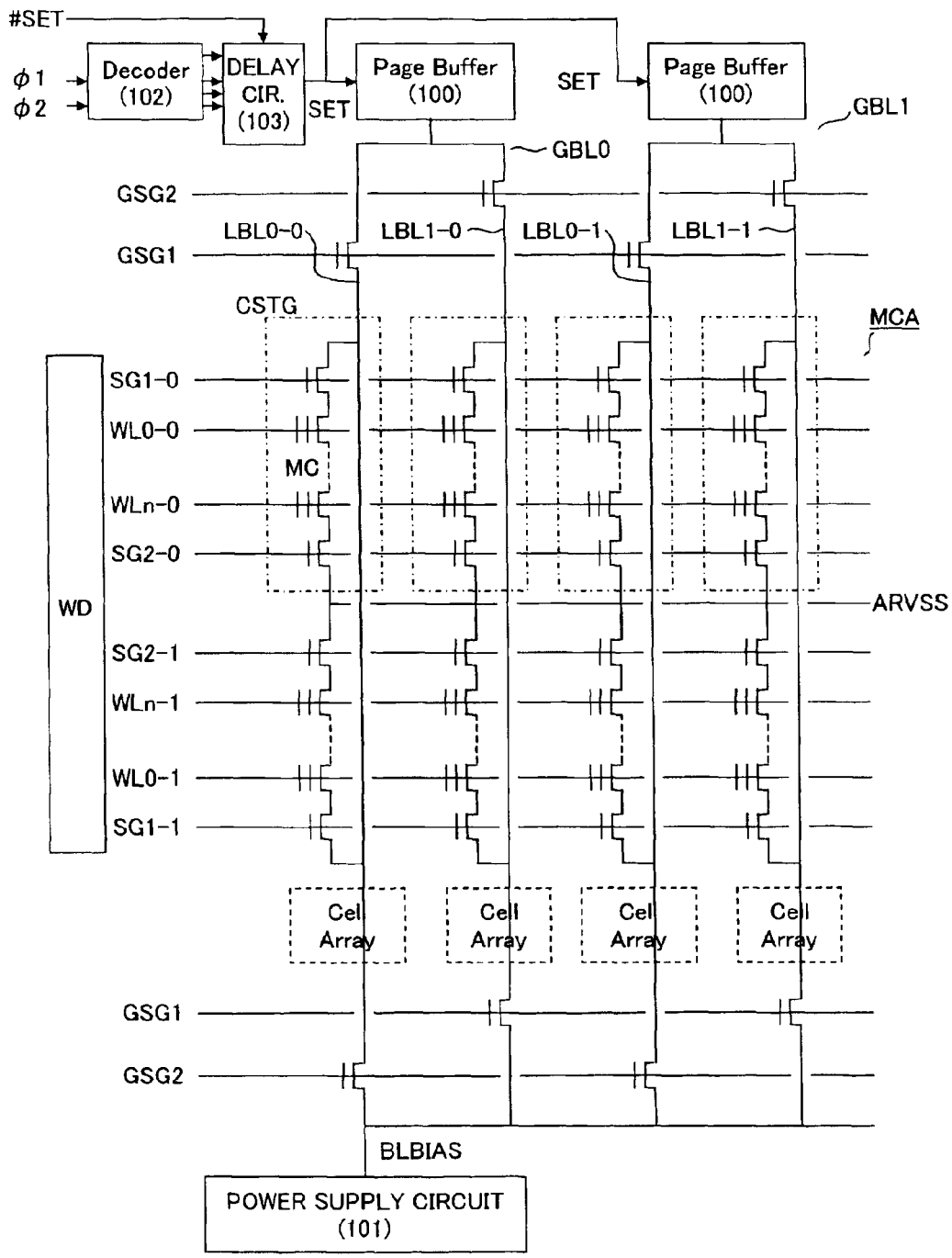
FIG. 6 is a circuit diagram of a NAND-type flash memory according to the first embodiment.

FIG. 6 is a circuit diagram of a NAND-type flash memory according to the first embodiment. Constituent elements which are the same as those in FIG. 1 have been assigned the same reference numerals. This embodiment differs from the prior art example in FIG. 1 in that a sense timing signal SET that determines the timing with which a page buffer 10 detects the bit line discharge potential is controlled by a delay circuit 103 and the delay interval of the delay circuit 103 differs according to the positions of selected memory cells in the bit line direction. Therefore, a decoder 102 for decoding row addresses Ø1 and Ø2 that indicate the positions of the selected memory cells in the bit line direction and for supplying the decoded output to the delay circuit 103 is provided.

Figure 7:
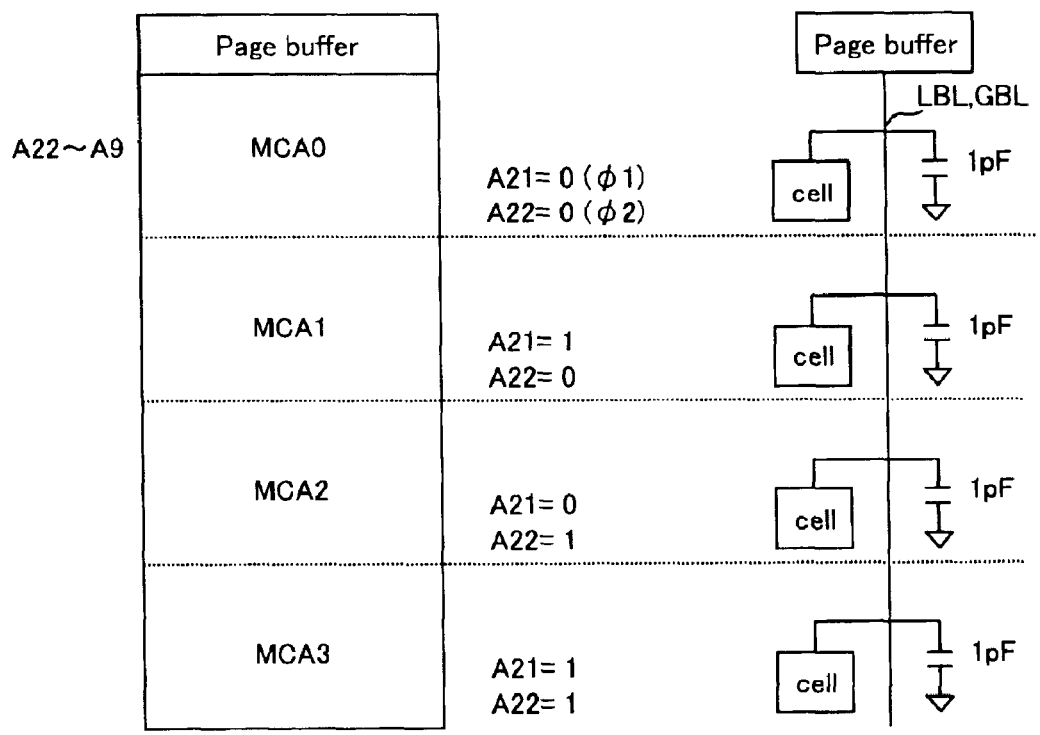
FIG. 7 shows the relationship between row addresses and the memory cell array according to the first embodiment.

FIG. 7 shows the relationship between row addresses and the memory cell array according to the first embodiment. In this embodiment, the memory cell array MCA is divided into four regions MCA0 to MCA3 in the bit-line direction. In a case where row addresses are constituted by fourteen bits A22 to A9, the upper two bits A21 and A22 are addresses which classify the four divided memory cell arrays MCA0 to MCA3. Therefore, these upper addresses A21 and A22 may be used with the position signals Ø1 and Ø2 that specify positions of the selected memory cells, these signals being supplied to the decoder 102. That is, the divided memory cell arrays MCA0 to MCA3 correspond to the illustrated combinations of the addresses A21 and A22.

Figure 8:
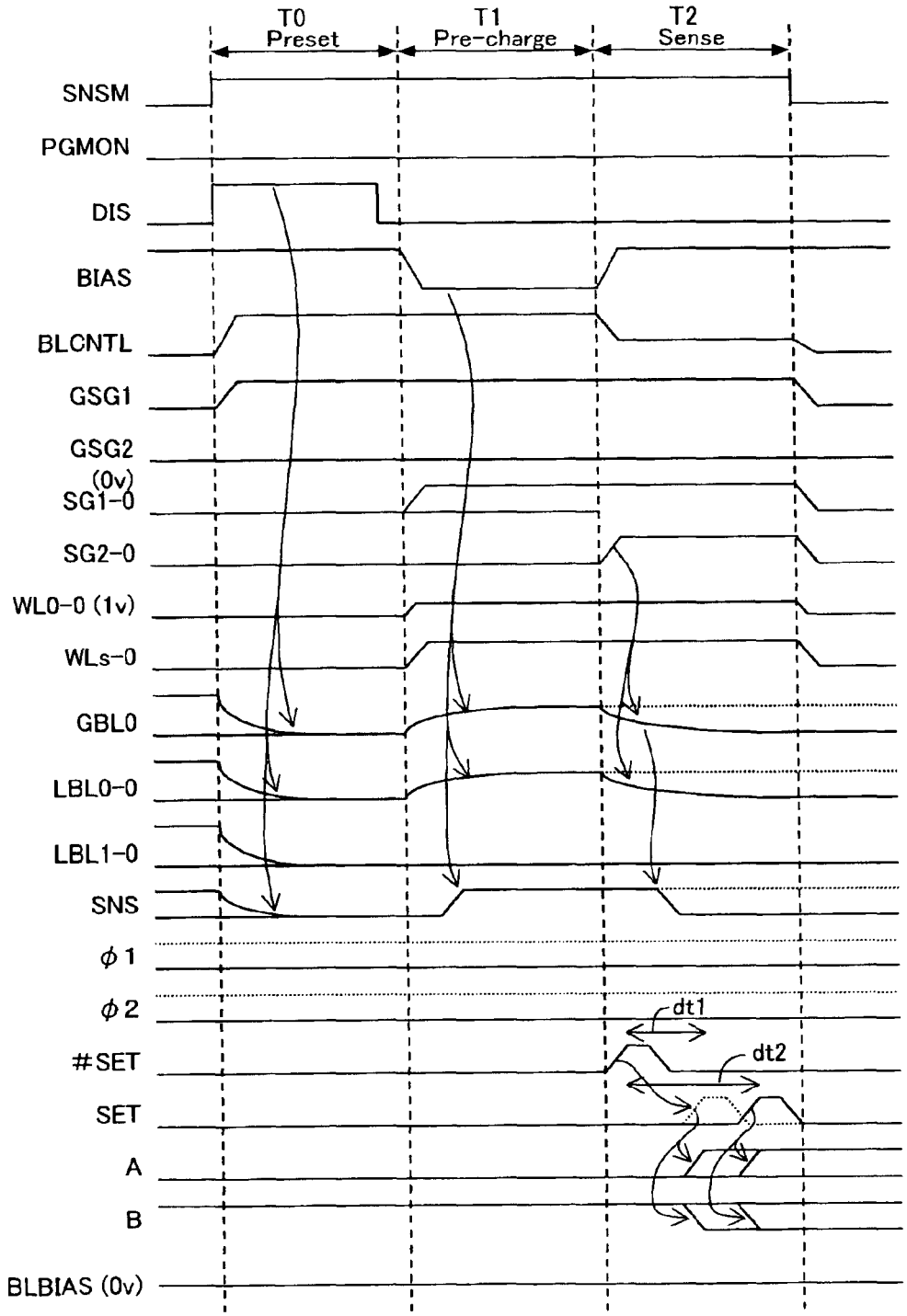
FIG. 8 is a timing chart of a program verify operation according to the first embodiment.

FIG. 8 is a timing chart of a program verify operation according to the first embodiment. The operation in the preset period T0 and the pre-charge period T1 is the same as that of the prior art example. In the sense period T2, the control signal BIAS assumes a high level, the pre-charge transistor P1 is non-conductive, and there is therefore no supply current supplied to the bit lines. Further, when the cell string select signal SG2-0 assumes a high level, the selected memory cell is connected to the ground potential ARVSS in the cell array and, the potential of the bit line is maintained or is discharged depending on the presence or absence of a cell current in the selected memory cell. Accordingly, the sense node SNS in the page buffer remains at a high level (the broken line in the FIG. 8) or assumes a low level (solid line in the FIG. 8).

On the other hand, the reference sense timing signal #SET is generated at the start of the sense period T2. Further, the reference sense timing signal #SET is delayed by the delay circuit 103 by a delay interval that corresponds with the position of the selected memory cell in the bit-line direction, and is supplied to the page buffer 100 as a sense timing signal SET. Hence, when the selected memory cell is positioned at a first distance close to the page buffer, the above delay interval dt1 is shorter and the sense timing signal SET is generated with relatively early timing. On the other hand, when the selected memory cell is positioned at a second distance a long way from the page buffer, the above delay interval dt2 is longer and the sense timing signal SET is generated with relatively late timing. Accordingly, in a case where the RC value of the bit line between the selected memory cell and the page buffer is small, the sense timing is controlled to be earlier, and when the RC value is large, the sense timing is controlled so as to be delayed. Therefore, the sense timing produced by the page buffer is controlled so as to be optimized.

The read operation of the first embodiment is similar to the above program verify operation. More particularly, same is that in the sense period T3, the reference sense timing signal #SET is delayed by the delay circuit 103 by a delay interval that corresponds with the position of the selected memory cell in the bit-line direction, and the sense timing signal SET for the page buffer is generated accordingly.

Figure 9:
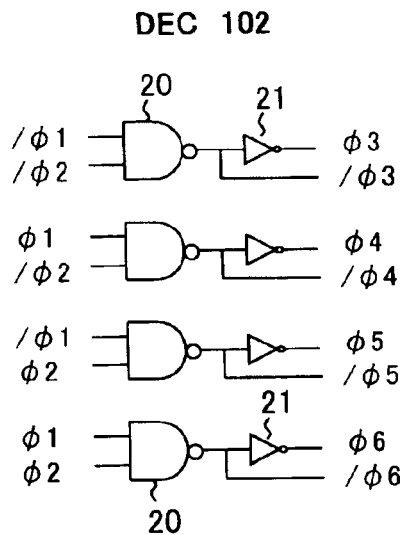
FIG. 9 is a specific circuit diagram of the decoder 102.
Figure 10:
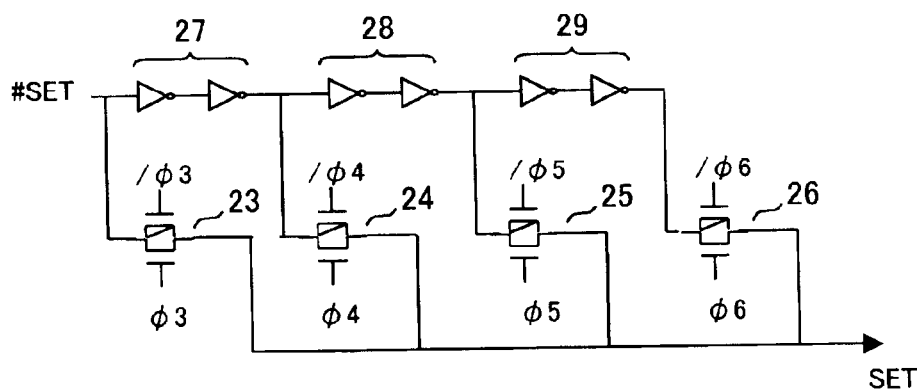
FIG. 10 is a specific circuit diagram of the delay circuit 103.

FIG. 9 is a specific circuit diagram of the decoder 102, and FIG. 10 is a specific circuit diagram of the delay circuit 103. These circuit diagrams are examples, and therefore other circuit constitutions can be implemented. The decoder 102 decodes the signals Ø1 and Ø2 that specify the positions of selected memory cells in the bit-line direction by means of respective NAND gates 20, and uses inverters 21 to generate four sets of mutually reverse-phased decoded signals Ø3 and /Ø3 to Ø6 and /Ø6.

The delay circuit 103 comprises delay passes 27, 28, and 29 that comprise a pair of inverters, and transfer gates 23 to 26, these transfer gates 23 to 26 being controlled by four sets of decoded signals Ø3 and /Ø3 to Ø5 and /Ø5. When any of the transfer gates is conductive, the reference sense timing signal #SET is delayed by the corresponding delay interval, and the sense timing signal SET is generated at each optical timing. In the example in FIG. 10, when the selected cell is positioned in the memory cell array MCA0 in FIG. 7, the transfer gate 23 is conductive and the delay interval is the shortest. Further, when the selected cell is positioned in the memory cell array MCA1, the transfer gate 24 is conductive; when the selected cell is positioned in MCA2, the transfer gate 25 is conductive; and when positioned in MCA3, the transfer gate 26 is conductive.

Figure 11:
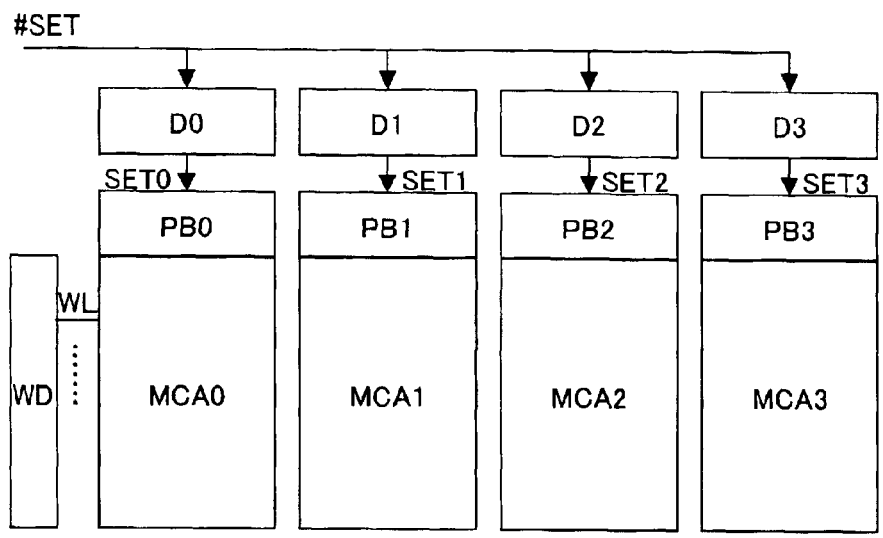
FIG. 11 shows a modified example of the first embodiment.

FIG. 11 shows a modified example of the first embodiment. In this modified example, the memory cell array is divided into four in the word line direction, and delay circuits D0 to D3 for delaying the reference sense timing signal #SET and which correspond with the divided regions MCA0 to MCA3 are provided. The delay intervals of these delay circuits D0 to D3 are such that the delay circuit D0, which corresponds with the divided region MCA0 that is closest to a word line driver circuit WD for driving the word lines, has the shortest delay interval, and the delay circuit D3, which corresponds with the divided region MCA3 that is the furthest from the word line driver circuit WD, has the longest delay interval.

In this modified example, even though a situation where greater numbers of cell transistors or select transistors are connected to one word line or one cell string select line according to an increased capacity, whereby the capacity thereof increases; and the word lines and select lines are narrower according to the minuteness and hence have a larger resistance; and the time interval required for the potential of the word lines and the cell string select lines to rise sufficiently differs from one divided region to the next; however, since the delay interval of the delay circuits D0 to D3 grows sequentially longer, the sense timing of the page buffer can be optimized. In the modified example, because page buffers PB0 to PB3 that correspond with the divided regions MCA0 to MCA3 are provided separately, a decoder circuit need not be provided.

Figure 12:
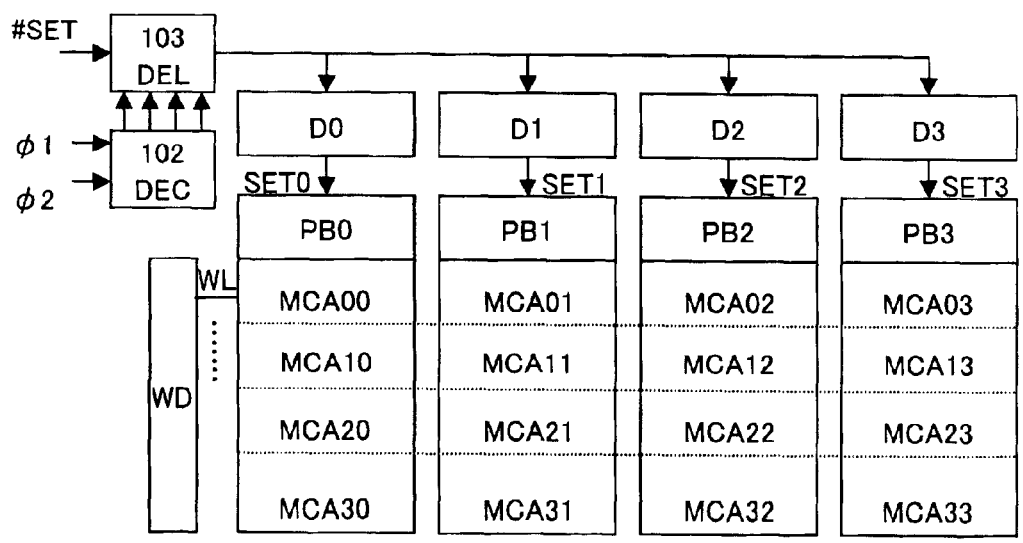
FIG. 12 shows another modified example of the first embodiment.

FIG. 12 shows another modified example of the first embodiment. In this modified example, the sense timing of the page buffers PB0 to PB3 differs according to the two-dimensional positions of the selected memory cells. In other words, this modified example is a combination of FIGS. 6 and 11. Therefore, this modified example comprises a decoder 102 for decoding the positional signals Ø1 and Ø2 that specify positions in the bit-line direction; a first delay circuit 103 for delaying the reference sense timing signal #SET; and a second delay circuit group D0 to D3 that corresponds with positions in the word line direction.

Similarly to the example in FIG. 6, the first delay circuit 103 is constituted such that if the selected memory cell is closer to the page buffer, the delay interval is shorter, and if this cell is a longer way from the page buffer, the delay interval is longer. On the other hand, the second delay circuit group D0 to D3 is set such that a delay circuit which corresponds with a memory cell that is closer to the word driver WD has a shorter delay interval, and a delay circuit that corresponds with a memory cell that is a longer way from the word driver WD has a longer delay interval.

[Second Embodiment]

Figure 13:
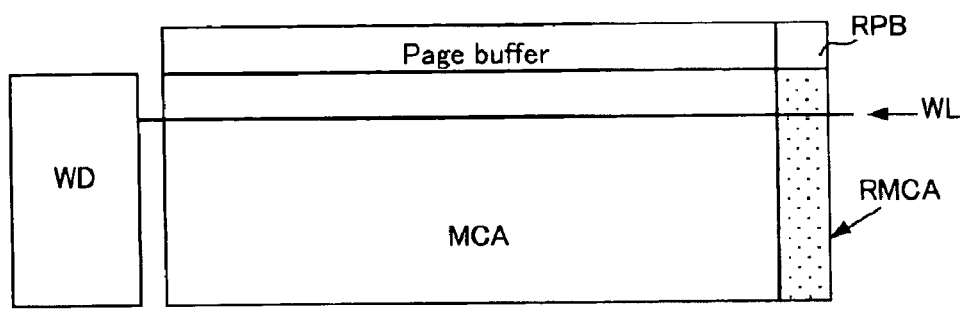
FIG. 13 is an outline constitutional view of the memory circuit according to the second embodiment.

FIG. 13 is an outline constitutional view of the memory circuit according to the second embodiment. In this embodiment, in addition to an ordinary memory cell array MCA, a reference memory cell array RMCA is provided in the position furthest from the word driver WD. Further, provided in the reference memory cell array are: reference bit lines, and reference memory cells disposed in the positions of intersection between the reference bit lines and the word lines, wherein the sense timing of the page buffers is determined in accordance with the potential produced when the reference bit lines are discharged by cell currents of reference memory cells that belong to the selected word lines.

Figure 14:
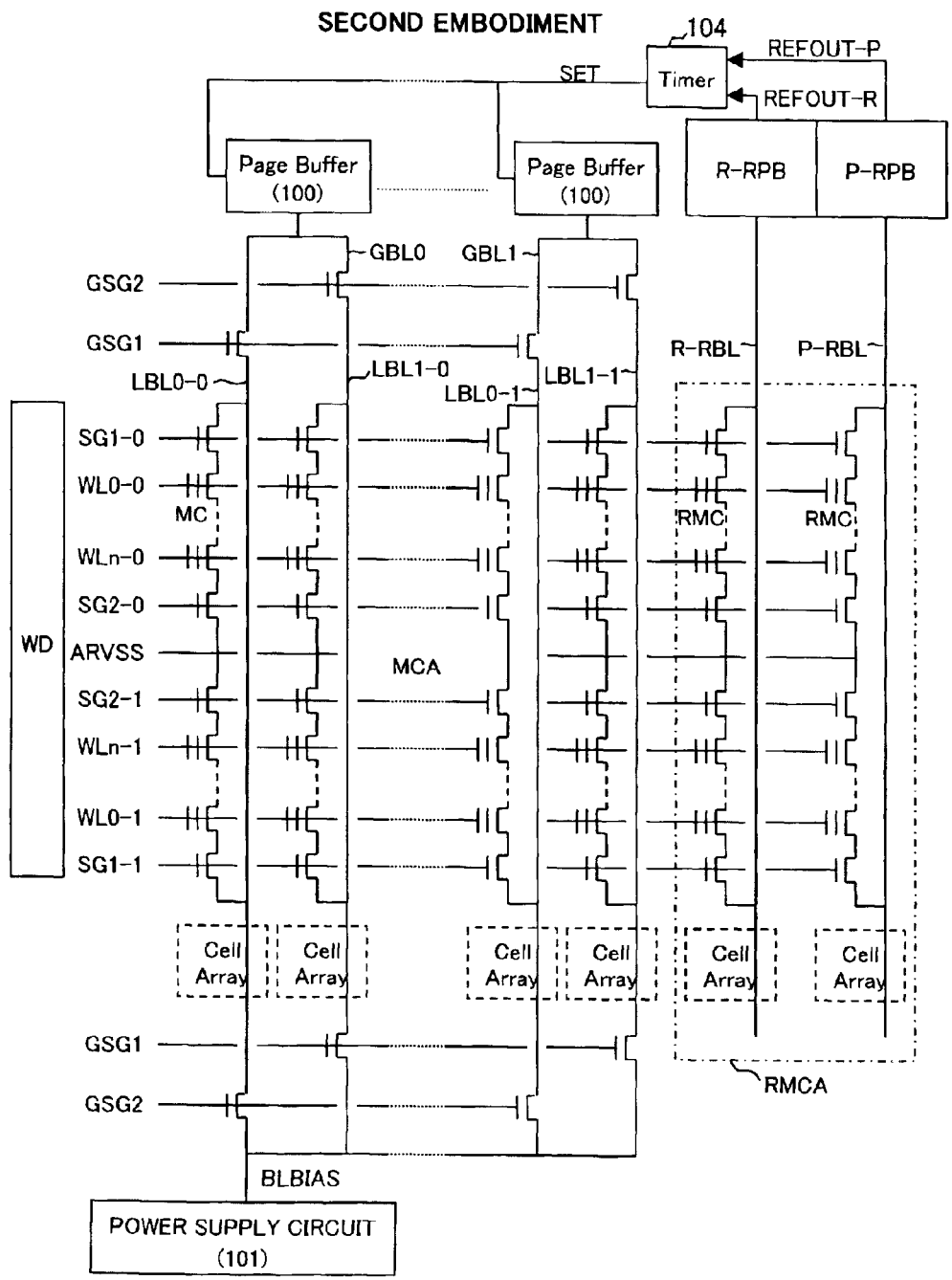
FIG. 14 is a detail circuit diagram of the memory circuit according to the second embodiment.

FIG. 14 shows a detail circuit diagram of the memory circuit according to the second embodiment. The reference memory cell array RMCA is provided on the opposite side to the word driver of the ordinary memory cell array MCA. The reference memory cell array RMCA of FIG. 14 is provided with a reference bit line R-RBL for a read operation and a reference bit line P-RBL for a program verify operation, and reference memory cells RMC are provided at the positions of intersection between these bit lines and word lines.

A reference page buffer R-RPB for a read operation is connected to the read reference bit line R-RBL and a reference page buffer P-RPB for a program verify operation is connected to the program-verify reference bit line P-RBL. The reference page buffers RPB generate a reference signal REFOUT for controlling the sense timing of the page buffers 100 that belong to the ordinary memory cell array MCA.

When a certain word line is selected and the corresponding cell string select lines are thus driven, reference memory cells RMC are selected in addition to the ordinary memory cells MC connected to the selected word line. Therefore, bit lines LBL and GBL in the pre-charged ordinary memory cell array are discharged by a cell current, and the reference bit lines RBL in the reference memory cell array are also discharged by a cell current in the reference memory cells. The discharge of the reference bit lines RBL is therefore detected by the reference page buffers RPB, and at the time when the reference bit lines RBL have dropped to a predetermined potential, the reference page buffers RPB generate the reference signal REFOUT.

Then, the reference signal REFOUT is supplied to the delay circuit 104, and the sense timing signal SET is outputted a fixed delay interval thereafter and supplied to the page buffers 100 that belong to the ordinary memory cell array. The page buffers 100 then detect the potential of the bit lines in response to the sense timing signal SET.

The reference memory cell array RMCA is disposed on the opposite side to the word driver WD of the ordinary cell array MCA. Hence, the timing with which the word lines and the string select lines at the reference memory cells are driven lags behind that of the ordinary memory cell array. On the other hand, when a selected memory cell MC is positioned close to the page buffer, the corresponding reference memory cell RMC is also close to the page buffer. Further, when the selected memory cell MC is positioned far from the page buffer, the corresponding reference memory cell RMC is also positioned far from the page buffer. Therefore, the transfer to the reference page buffers RPB of the reference bit line discharge potential produced by the reference memory cells lags behind that of the ordinary bit lines.

Therefore, because of the use of the reference memory cells, the reference signal REFOUT is controlled with the latest timing in the word line direction and, in the bit line direction, the reference signal REFOUT is controlled with timing that corresponds with the position of the selected memory cell in the bit line direction.

Figure 2:
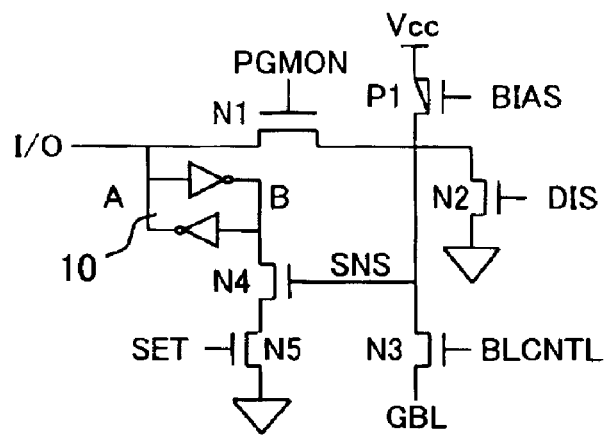
FIG. 2 is a circuit diagram of a page buffer.
Figure 3:
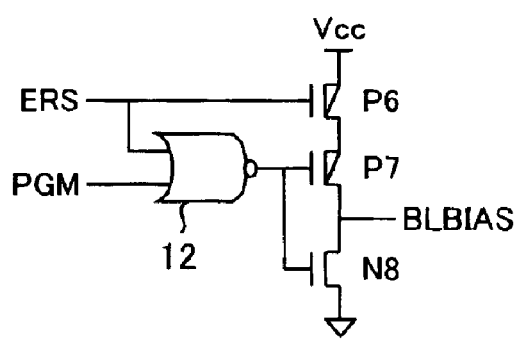
FIG. 3 is a circuit diagram of a power supply circuit.
Figure 15:
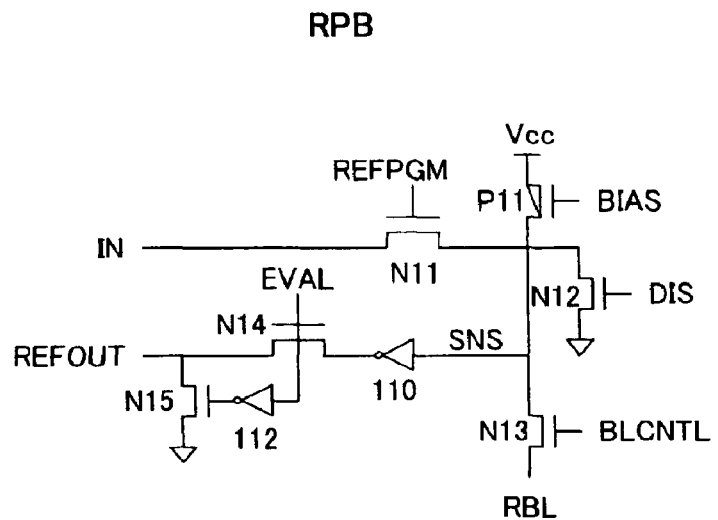
FIG. 15 is a circuit diagram of a reference page buffer.

FIG. 15 is a circuit diagram of a reference page buffer. Similarly to the ordinary page buffer circuit of FIG. 2, this reference page buffer comprises a reset transistor N12, a pre-charge transistor P11, a transistor N11 connected to an input IN, and a transistor N13. However, a latch circuit is not provided. In place of a latch circuit, a change in the potential of the sense node SNS is outputted as a reference signal REFOUT via an inverter 110 and a transistor N14. A transistor N15 is a transistor for resetting the reference signal REFOUT to a low level.

Figure 4:
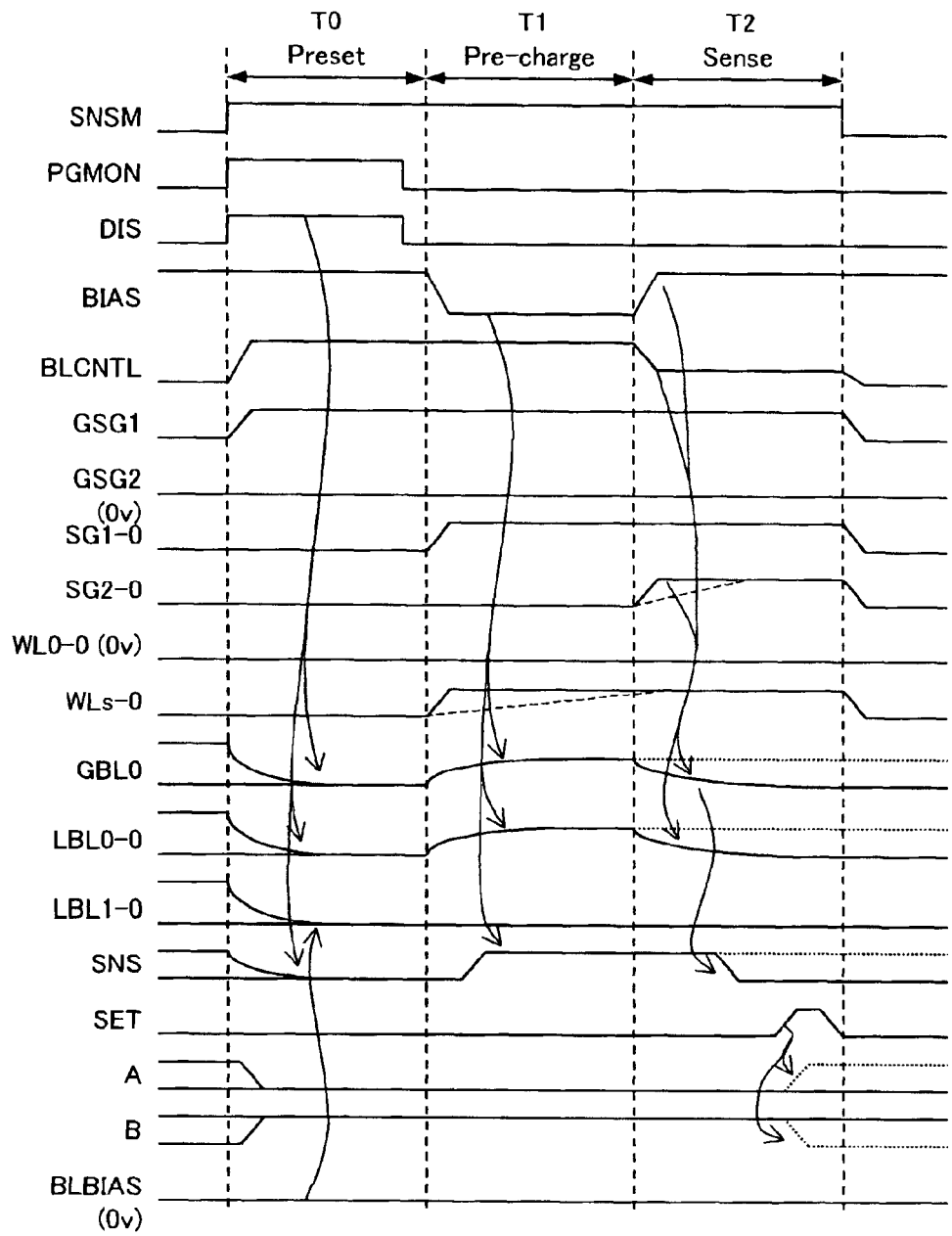
FIG. 4 is a timing chart of a conventional AC sensing operation during reading.
Figure 5:
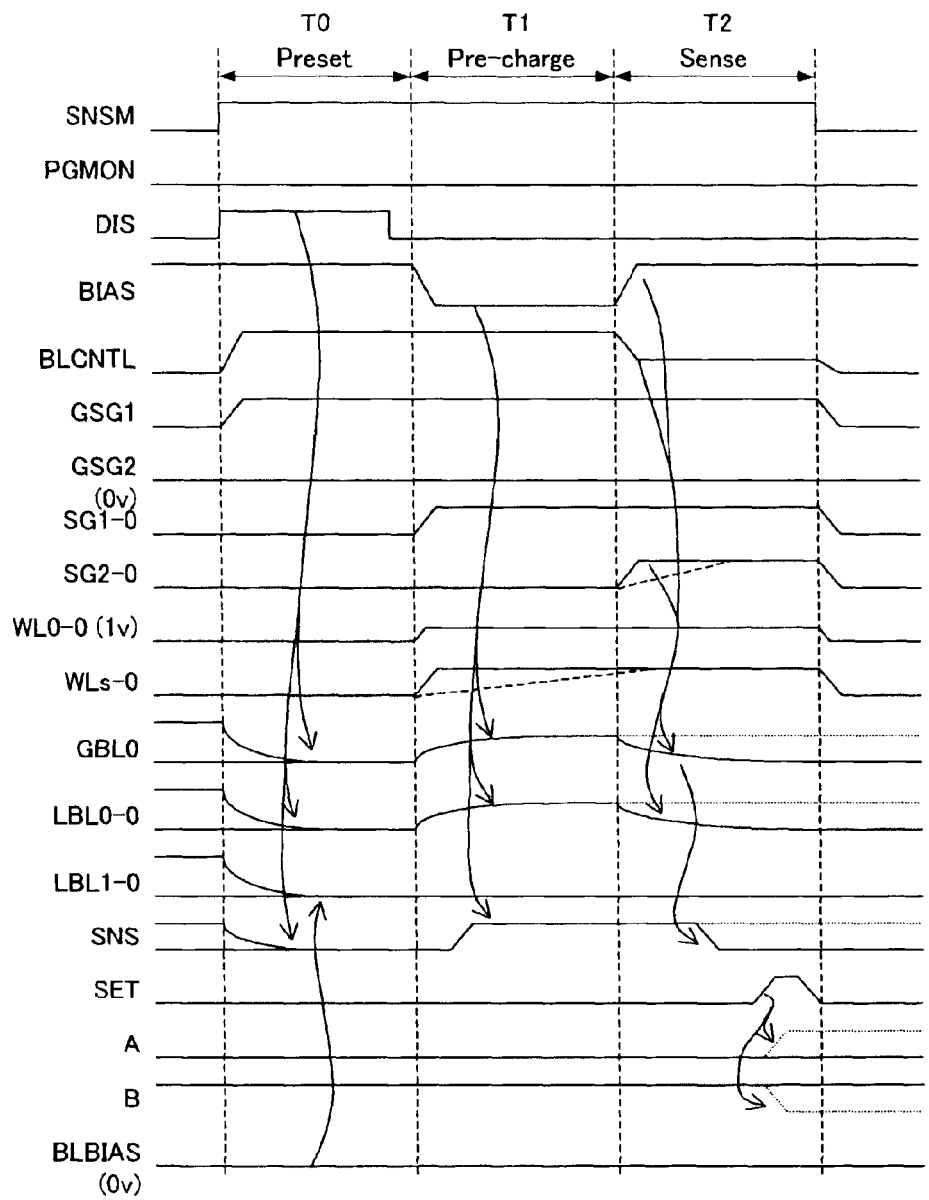
FIG. 5 is a timing chart of a conventional AC sensing operation during a verify operation.
Figure 16:
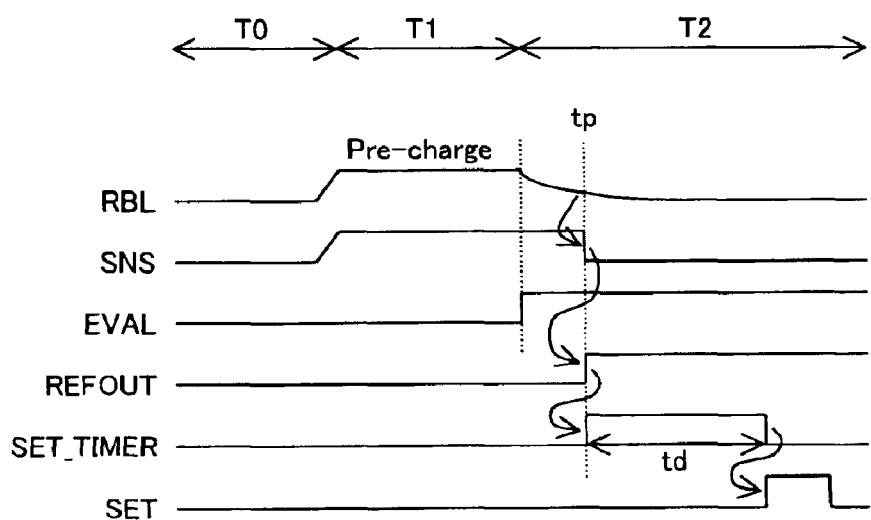
FIG. 16 is a timing chart of the operation of the reference page buffer.

FIG. 16 is a timing chart of the operation of the reference page buffer. References are made so as to combine the program verify operation of FIG. 8 and the read operation of FIG. 4. First of all, in the pre-charge period T1, the pre-charge transistor P11 is conductive, and the sense node SNS and the reference bit lines RBL are pre-charged to the level of the power supply voltage Vcc. Thereupon, the control signal EVAL is at a low level, the transistor N15 is conductive, and the reference signal REFOUT is at a low level.

Then, when the sense period T2 begins, the control signal EVAL assumes a high level and a change in the sense node SNS can then be transferred as the reference signal REFOUT. In response to the rise of a cell string select signal (not shown), a reference bit line RBL is discharged by the cell current in a reference memory cell. The speed of this discharge depends on the magnitude of the cell current in the reference memory cell RMC and on the position of the reference memory cell, and the timing with which the sense node SNS accordingly drops is dependent on the magnitude of the cell current, and the distance between the selected reference memory cell RMC and the page buffer.

When, as a result of the discharge of the reference bit line RBL, the sense node SNS drops to a low level at a trip point tp, the reference signal REFOUT rises to a high level. In response to this rise of the reference signal REFOUT, the sense timing signal SET is generated after a predetermined delay interval td of a timer circuit 104, and, by way of response, the potential of the respective sense node SNS of the page buffers 100 of the ordinary memory cell array is detected.

Figure 17:
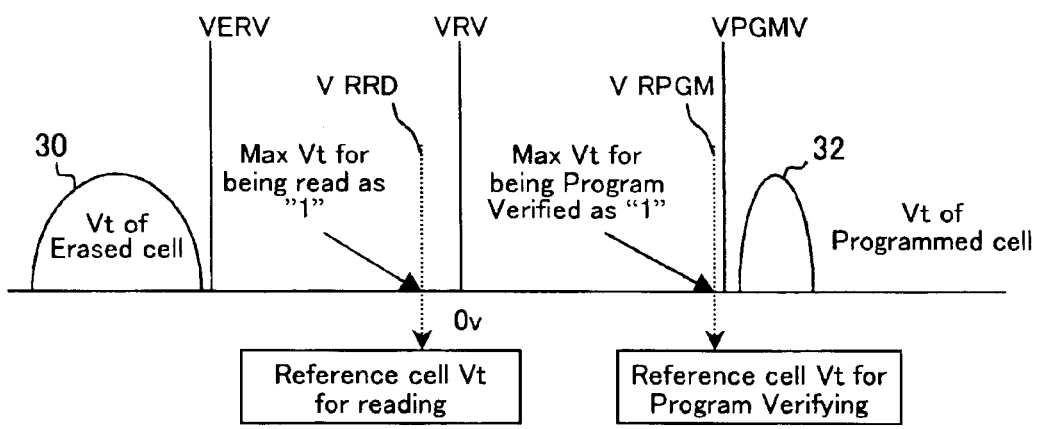
FIG. 17 illustrates threshold voltages of reference memory cells.

FIG. 17 illustrates threshold voltages of reference memory cells. In FIG. 17, threshold voltages and gate voltages are plotted on the horizontal axis, in the center of which is a dead-center voltage 0V, negative voltages lying to the left thereof and positive voltages to the right. In the figure, an erased cell threshold voltage distribution 30 is on the negative voltage side and a programmed cell threshold voltage distribution 32 is on the positive voltage side, and a read verify voltage VRV, which is applied to word lines during a read operation, is controlled to be substantially 0V. Accordingly, if a selected memory cell is an erased cell, the cell transistor thereof is conductive and a predetermined cell current is generated such that the bit line is discharged. However, if a selected memory cell is a programmed cell, the cell transistor thereof is non-conductive and a cell current is not generated, meaning that the bit line is not discharged. Also, a program verify voltage VPGMV, which is applied to word lines during a program verify operation, is a voltage that is slightly lower than the threshold voltage distribution 32 for a programmed cell, whereas an erase verify voltage VREV during an erase verify operation is a voltage that is slightly higher than the erased cell threshold voltage distribution 30.

As shown, a read reference cell threshold voltage VRRD is slightly lower than the read verify voltage VRV, and is set at a level that is sufficiently higher than the erased cell threshold voltage distribution 30. This setting is performed by controlling the quantity of electrons injected into the floating gate or trapping gate when a read reference memory cell is programmed via the reference page buffer. Because the read reference cell threshold voltage VRRD is set to the above-mentioned level, when the read verify voltage VRV is applied to the word line, the cell current of the read reference cell is then made smaller than an erased-cell cell current in an ordinary memory cell. Hence, the speed of discharge of the read reference bit lines R-RBL is less than that of the bit lines in the ordinary memory cell array and the erased state of an ordinary memory cell can therefore be reliably detected by the page buffers. In other words, the reference memory cell threshold voltage VRRD is set such that the reference bit line discharge produced by the reference memory cells lags behind the bit line discharge produced by the ordinary memory cells.

If the read reference cell threshold voltage VRRD is set at a level close to the erased-cell threshold voltage distribution 30, in case where a threshold voltage Vt of an erased cell is closer to 0V, it is possible that the cell current of the reference cell will be larger that of ordinary cell and that the read-out timing of the erased cell will be too early.

On the other hand, as illustrated, the threshold voltage VRPGM of a program verify reference cell is set at a slightly lower level than the program verify voltage VPGMV. As a result of setting this voltage VRPGM at this level, even when the program verify voltage VPGMV is applied to word lines during a program verify operation, the reference cell is conductive and the reference bit line P-RBL can therefore be discharged. Moreover, because the threshold voltage of a cell that is judged to be in an unprogrammed state in the program verify operation is at a lower level than the program verify voltage VPGMV, the reference cell threshold voltage VRPGM is set so as to be higher than this threshold voltage for an unprogrammed cell. As a result, the cell current of the reference cell is smaller than the cell current of the unprogrammed cell which is to be detected, and hence the reference bit line discharge lags behind any bit line discharge of the unprogrammed cell.

If the reference cell threshold voltage VRPGM is too low, the cell current of the reference cell is larger than the cell current of the unprogrammed cell for the program verify voltage VPGMV, and the discharge of the reference bit line takes place first, even in a condition in which any bit line is barely discharged by the unprogrammed cell. The sense timing signal SET is therefore generated too early. As a result, the judgment is made that there is no cell current in the unprogrammed cell either (data 0) and this cell then undergoes a program verify operation. Since a program verify operation is normally performed for each cell, once a cell has undergone the program verify operation, a programming pulse is not subsequently applied to this cell and therefore the cell remains in an unprogrammed state.

Accordingly, the threshold voltage VRPGM of a program verify reference memory cell is set such that the reference bit line discharge produced by a verify reference memory cell lags behind the bit line discharge produced by ordinary memory cells not in a programmed state.

Although not shown in FIG. 14, the reference memory cell array may be provided with an erasure reference bit line, erasure reference memory cells and also a corresponding page buffer. Further, the sense timing for the erase verify operation is controlled in accordance with the discharge of the erasure reference bit line. In this case, the threshold voltage of the erasure reference memory cells is preferably set at a slightly higher level than an erase verify voltage VERV.

[Third Embodiment]

Figure 18:
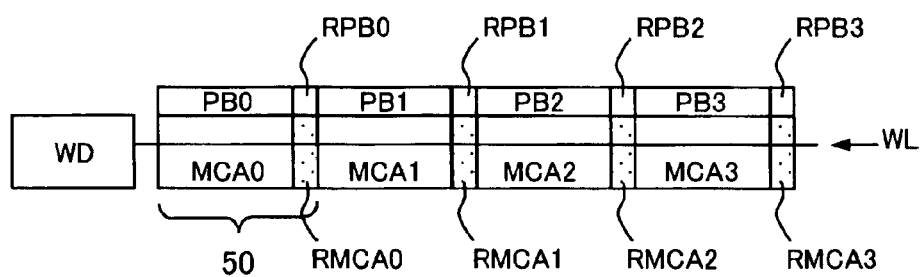
FIG. 18 is an outline constitutional view of the memory circuit according to the third embodiment.

FIG. 18 is an outline constitutional view of the memory circuit according to the third embodiment. This example is effective as a countermeasure in a case where the time constant of the word lines WL and the select-control lines SG is large. The memory cell array of this memory circuit is divided into a plurality of regions MCA0 to MCA3 in the word line direction, and the divided regions MCA0 to MCA3 comprise: reference memory cell arrays RMCA0 to RMCA3 including reference bit lines and reference memory cells disposed in the positions of intersection between the reference bit lines and the word lines WL; and reference page buffers RPB0 to RPB3 that correspond with these reference memory cell arrays. Further, the sense timing of the page buffers PB0 to PB3 that belong to these divided regions is determined in accordance with the potential produced when the reference bit lines are discharged by cell currents of reference memory cells that belong to selected word lines, in the corresponding divided regions.

In the second embodiment, the sense timing performed by the ordinary memory cell page buffers is controlled by the reference cells, the reference bit lines and the reference page buffers. Because the discharge of the reference bit lines lags behind the bit line discharge by the erased-cell cell currents of the ordinary memory cells, the sense timing is established as timing that allows the ordinary bit lines to be discharged sufficiently.

However, when the lag of the sense timing is excessive, the period of discharge of the ordinary bit lines by the cell currents of ordinary cells is then too long, and a programmed cell is sometimes erroneously verified as being unprogrammed in a program verify operation. Particularly in cases where the reference memory cell array is provided on the opposite side to the word driver WD, since the discharge period for an ordinary memory cell in the vicinity of the word driver WD becomes too long, even when this cell is in a programmed state (data 0) (this means the bit line does not drop below the pre-charge level), the level of the ordinary bit line drops well below the pre-charge level on account of the cell leak current, and hence there are cases where this cell is judged as being unprogrammed and then has a useless programming pulse applied thereto. On the other hand, in cases where the discharge period is too short for an ordinary memory cell that is a long way from the word driver WD, even when an ordinary cell is insufficiently programmed (this means the bit line should drop below the pre-charge level), the corresponding ordinary bit line does not drop below the pre-charge level due to the short period, and this cell is judged as being programmed and therefore the programming operation is completed with this cell in an unprogrammed state.

Thus, in the program verify operation, with regard to the positions of the cells to be verified in the word line direction, sense timing is preferably established as timing that is not too late or too early. Meanwhile, in the bit line direction, sense timing is desirably established in accordance with the distance to the page buffers.

According to the above third embodiment, the memory cell array MCA is divided into a plurality of regions in the word line direction and sense timing is controlled by using the reference memory cell array in each divided region. Accordingly, periods until detection during which bit lines are discharged can be equalized irrespective of the positions of selected memory cells, and hence the sense timing of the page buffers corresponding to the divided regions can be optimized. More particularly, because the margin between the threshold voltage of a verify reference memory cell, and the threshold voltage of a memory cell that is not in a programmed state or the threshold voltage of a memory cell that is in a programmed state is small, by equalizing the periods during which bit lines are discharged irrespective of the positions of the selected memory cells, it is possible to prevent a misjudgment that a memory cell in an unprogrammed state is in a programmed state, and a misjudgment that a memory cell in a programmed state is in an unprogrammed state.

Figure 19:
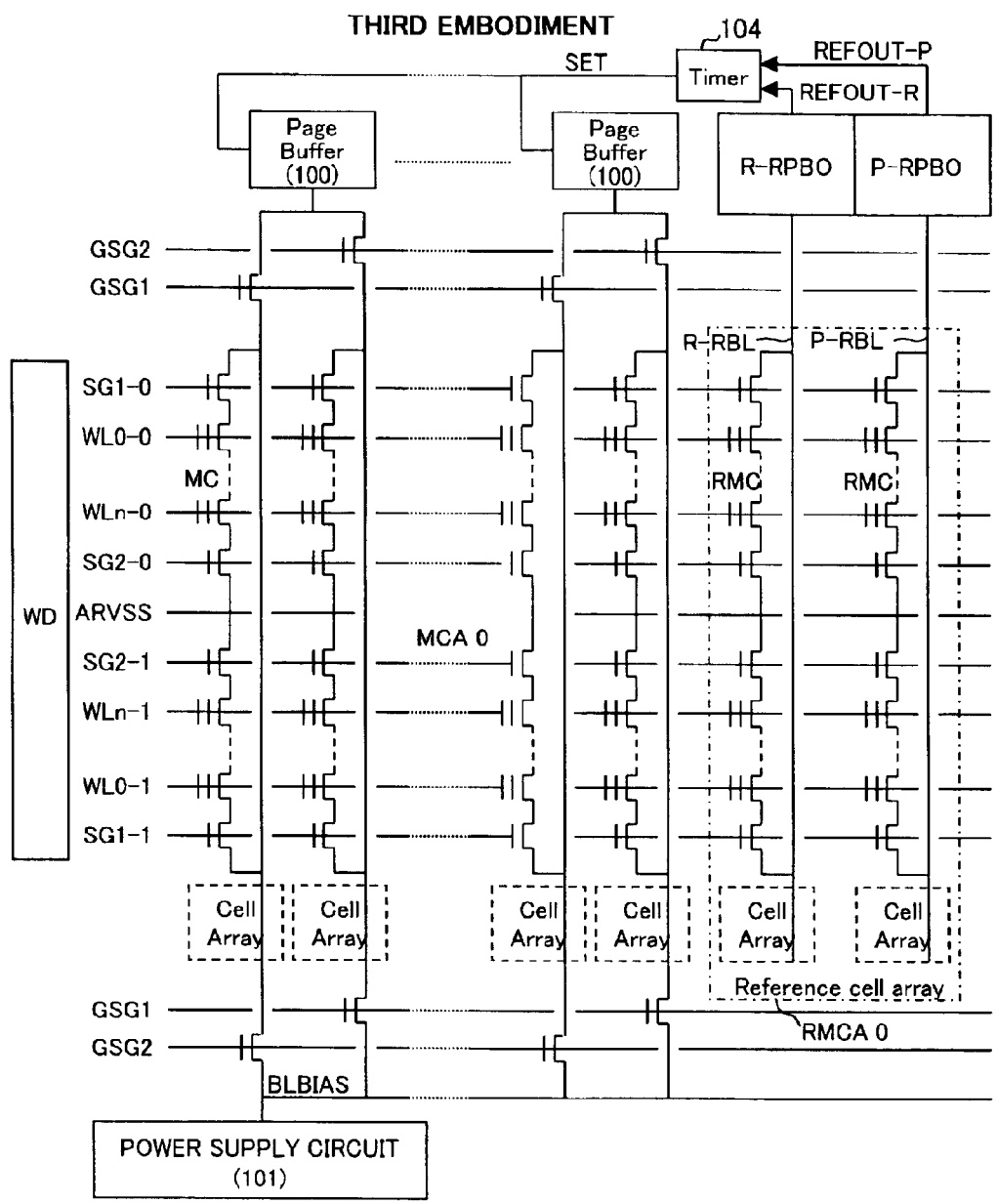
FIG. 19 is a detail circuit diagram of the memory circuit according to the third embodiment.

FIG. 19 shows a detail circuit diagram of the memory circuit according to the third embodiment. FIG. 19 shows a divided memory cell array region MCA0 on the left side, together with a reference memory cell array RMCA0 and reference page buffers R-RPB0 and P-RPB0 that correspond with this memory cell array region MCA0, these parts being denoted by 50 in FIG. 18. Other divided memory cell arrays and the like have been omitted. The constitution of the reference page buffer is the same as that of the second embodiment shown in the FIG. 14. Further, the threshold voltages of the reference memory cells are the same as those of the second embodiment. That is, as shown in FIG. 17, the threshold voltages of the read reference memory cells and the program verify reference memory cells are set at the highest level among the levels for which the reference memory cells are judged as data "1" (erased state) during a read operation and set at the highest level among the levels for which the reference memory cells are judged as data "1" during a program verify operation.

Figure 20:
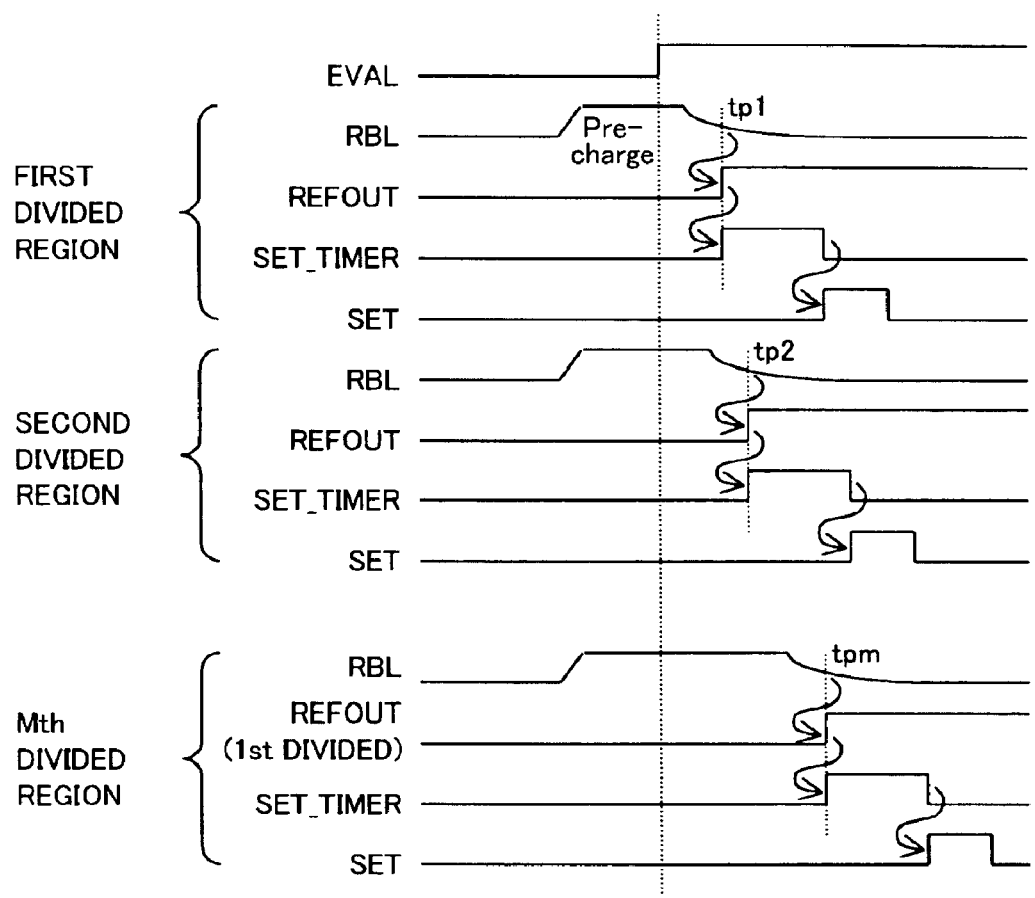
FIG. 20 is a timing chart of the operation of the reference page buffer.

FIG. 20 is a timing chart of the operation of the reference page buffer according to the third embodiment. FIG. 20 shows the operation of a first divided region, a second divided region and an Mth divided region for a case where M divided regions are formed.

The operation is substantially the same as that shown in FIG. 16 of the second embodiment. The discharge start time for the reference bit lines RBL is earliest in the first divided region which is closest to the word driver WD, and the corresponding discharge trip point tp1 is also the earliest. Therefore, the reference output REFOUT of the reference page buffer of the first divided region is the first to rise to a high level hence the sense timing signal SET is also the first to rise to a high level.

On the other hand, in the second divided region and the Mth divided region, along separating from the word driver WD, the propagation of the drive by the word driver WD to the select signal SG2-0 that serves to connect a cell string to the ground potential ARVSS is delayed and the discharge start timing for the reference bit lines is delayed sequential. The sense timing signal SET is accordingly also controlled so as to become sequentially delayed.

Thus, the sense timing for the divided memory cell arrays MCA0 to MCA3 is controlled so as to be sequentially delayed in accordance with the position thereof in the word line direction, that is, the distance from the word driver. Therefore, the bit line discharge periods of the divided memory cell arrays are not too long and not too short, and are controlled so as to be optimal.

The second and third embodiments are provided with a delay circuit 104 whereby the reference signal REFOUT from the reference page buffers is delayed by a fixed time interval, but the reference signal REFOUT from the reference page buffers may also be supplied directly to the ordinary page buffers as the sense timing signal SET.

According to the present invention described hereinabove, the sense timing for a bit line potential which is discharged by a cell current can be optimized. As a result, even when the cell current is reduced and the RC value of the bit lines and word lines and so forth is higher in accordance with an increased capacity and voltage reduction, the distribution of the threshold voltages of the memory cells from the perspective of the page buffers grows substantially narrower, whereby the reliability of the memory circuit is improved.

What is claimed is:

1. A memory circuit, comprising:
   a memory cell array including a plurality of bit lines, a plurality of word lines, and a plurality of memory cells disposed in positions of intersection between the bit lines and the word lines; and
   a page buffer, which is connected to the bit line and which detects memory cell data by judging with predetermined sense timing a potential of the bit line when a pre-charged bit line potential is discharged in accordance to a cell current of a selected memory cell, wherein the sense timing differs in accordance with a position of the selected memory cell in the memory cell array, and
   wherein, when the selected memory cell is positioned at a first distance from the page buffer, the page buffer makes a judgment by means of first sense timing, and when the selected memory cell is positioned at a second distance from the page buffer which is longer than the first distance, the page buffer makes a judgment by means of second sense timing that lags behind the first sense timing.

2. The memory circuit according to claim 1, wherein, when the selected memory cell is positioned at a first distance from a word line driver circuit for driving the word lines, the page buffer makes a judgment by means of first sense timing, and when the selected memory cell is positioned at a second distance from the word line driver circuit which is longer than the first distance, the page buffer makes a judgment by means of second sense timing that lags behind the first sense timing.

3. The memory circuit according to claim 1, further comprising:
   a delay circuit for generating a sense timing signal by delaying a reference sense timing signal by a delay interval that depends on an address that specifies the position of the selected memory cell, wherein the page buffer detects the potential of the corresponding bit line in response to the sense timing signal supplied by the delay circuit.

4. A memory circuit, comprising: an ordinary memory cell array including a plurality of bit lines, a plurality of word lines, and a plurality of memory cells disposed in positions of intersection between the bit lines and the word lines; a page buffer, which is connected to the bit line and which detects memory cell data by judging with predetermined sense timing a potential of the bit line when a pre-charged bit line potential is discharged in accordance to a cell current of a selected memory cell; and a reference memory cell array including reference bit line, and reference memory cells disposed in positions of intersection between the reference bit line and the word lines, wherein the sense timing of the page buffer is determined in accordance with a potential of the reference bit line which is discharged by cell currents of the reference memory cells that belong to a selected word line.

5. The memory circuit according to claim 4, wherein the reference bit line is disposed in position further from the word line driver circuit for driving the word lines than the ordinary memory cell array.

6. The memory circuit according to claim 4, wherein threshold voltages of the reference memory cells are set such that the reference bit line discharge produced by the reference memory cells lags behind the bit line discharge produced by ordinary memory cells in an erased state.

7. The memory cell according to claim 4, wherein threshold voltages of the reference memory cells are set at the highest level among levels for which the reference memory cells are judged as being in an erased state.

8. The memory circuit according to claim 4, wherein the reference memory cells and the reference bit line include at least reference memory cells and a reference bit line for a read operation as well as reference memory cells and a reference bit line for a program verify operation; and threshold voltages of the program verify reference memory cells are set such that the reference bit line discharge produced by the program verify reference memory cells lags behind the bit line discharge produced by memory cells that are ordinary memory cells and not in a programmed state.

9. The memory circuit according to claim 4, wherein the reference memory cells and the reference bit line include at least reference memory cells and a reference bit line for a read operation as well as reference memory cells and a reference bit line for a program verify operation; and threshold voltages of the program verify reference memory cells are set at the highest level among levels for which the program verify reference memory cells are judged as being in an unprogrammed state during a program verify operation.

10. A memory circuit, comprising: a memory cell array including a plurality of bit lines, a plurality of word lines, and a plurality of memory cells disposed in positions of intersection between the bit lines and the word lines; and a page buffer, which is connected to the bit line and which detects memory cell data by judging with predetermined sense timing a potential of the bit line when a pre-charged bit line potential is discharged in accordance to a cell current of a selected memory cell, wherein the memory cell array is divided into a plurality of regions in the word line direction, and the divided regions include a reference bit line and reference memory cells disposed in positions of intersection between the reference bit line and the word lines; and the respective sense timing of the page buffers that belong to the divided regions is determined in accordance with a potential of the reference bit line which is discharged by cell currents of reference memory cells connected to a selected word line, in the corresponding divided regions.

11. The memory circuit according to claim 10, wherein the reference bit lines in the divided regions are disposed in a position further from the word line driver circuit for driving the word lines than the ordinary memory cell array in each divided region.

12. The memory circuit according to claim 10, wherein threshold voltages of the reference memory cells are set such that the reference bit line discharge produced by the reference memory cells lags behind the bit line discharge produced by ordinary memory cells in an erased state.

13. The memory circuit according to claim 10, wherein the reference memory cells and the reference bit line include at least reference memory cells and a reference bit line for a read operation as well as reference memory cells and a reference bit line for a program verify operation; and threshold voltages of the program verify reference memory cells are set such that the reference bit line discharge produced by the program verify reference memory cells lags behind the bit line discharge produced by memory cells that are ordinary memory cells and not in a programmed state.

* * * * *